United States Patent [19]

Kuroiwa et al.

[11] Patent Number: 5,754,081
[45] Date of Patent: May 19, 1998

[54] CLOCK SIGNAL GENERATION AND TEST CIRCUITRY

[75] Inventors: Mitiaki Kuroiwa; Yoshihisa Hori, both of Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 735,638

[22] Filed: Oct. 23, 1996

[30] Foreign Application Priority Data

May 17, 1996 [JP] Japan ................. 8-123404

[51] Int. Cl.$^6$ .................. H03B 5/00; H03B 5/20; H03B 28/00
[52] U.S. Cl. .................. 331/49; 331/44; 331/57; 331/173
[58] Field of Search .................. 331/44, 49, 57, 331/143, 158, 173, 175

[56] References Cited

U.S. PATENT DOCUMENTS 5,623,234  4/1997  Shaik et al. ................. 331/49

FOREIGN PATENT DOCUMENTS 4-33116   2/1992  Japan.
6260836   9/1994  Japan.

*Primary Examiner*—David Mis
*Attorney, Agent, or Firm*—Leydig, Voit & Mayer, Ltd.

[57] ABSTRACT

The present invention provides a semiconductor device wherein the oscillation of a clock signal oscillation circuit is halted by control carried out by a CPU when a clock-signal switching circuit selects either a clock signal generated by a CR oscillation circuit or a clock signal generated by an oscillator-driven oscillation circuit. A frequency divider divides the frequency of a clock signal generated by the clock signal oscillation circuit, supplying a clock signal with a divided frequency to the clock-signal switching circuit.

6 Claims, 7 Drawing Sheets

5,754,081

1

CLOCK SIGNAL GENERATION AND TEST CIRCUITRY

BACKGROUND OF THE INVENTION

1. Field of the Invention

The present invention relates to a semiconductor device used in a microcomputer or the like which includes a plurality of clock-signal generating circuits, and can select a required clock-signal generating circuit adopted to external components.

2. Description of the Prior Art

FIG. 1 is a block diagram showing the configuration of a conventional clock-signal control unit employed in a microcomputer disclosed in JP-A 4/33116. Reference numeral 30A denotes a microcomputer and reference numeral 31 denotes an external component such as a crystal oscillator i.e., an oscillator whose frequency is controlled by a resonator, such as a crystal. Reference numeral 32 is a reset-signal generating circuit for supplying a reset signal to the microcomputer 30A. Reference numeral 33 is a clock signal oscillation circuit (hereinafter, oscillation circuit) for generating a clock signal and reference numeral 34 is an oscillator-driven oscillation circuit for generating a clock signal from a signal outputted by the external oscillator 31. Reference numeral 7 is a clock-signal switching circuit for selecting either the clock signal generated by the oscillation circuit 33 or the clock signal generated by the oscillator-driven oscillation circuit 34 in accordance with a select signal and supplying the selected clock signal to internal circuits of the microcomputer 30A (not shown).

The operation of the clock-signal control circuit is explained as follows.

The oscillation circuit 33 is an oscillator having a good build-up characteristic such as, for example, ring oscillator. When the supply of power to the microcomputer 30A is started, the clock-signal switching circuit 7 is set to select the clock signal generated by the oscillation circuit 33 which begins oscillation immediately after the supply of power is started. As a result, the clock-signal switching circuit 7 supplies the clock signal to the internal circuits of the microcomputer 30A right after the supply of power is started.

When the supply of power is started, the reset-signal generating circuit 32 provides the reset signal at a reset level to the microcomputer 30A for a predetermined period in order to reset the microcomputer 30A and then changes the reset signal level of the for ending the reset state. As the reset state of the microcomputer 30A is ended, the clock-signal switching circuit 7 is set to select the clock signal generated by the oscillator-driven oscillation circuit 34. Thereafter, the internal circuits of the microcomputer 30A perform out operations based on the clock signal generated by the oscillator-driven oscillation circuit 34. In this way, before the clock signal generated by the oscillator-driven oscillation circuit 34 is stabilized, the clock signal generated by the oscillation circuit 33 is supplied to the internal circuits of the microcomputer 30A.

FIG. 2 is a block diagram showing the configuration of another conventional clock-signal control unit employed in a microcomputer disclosed in JP-A 6/260836. Reference numeral 30B shown in the figure is the microcomputer. Reference numerals 2 and 3 denote $X_{in}$ and $X_{out}$ terminals of the microcomputer 30B, respectively. Since a resistor or an oscillator i.e., a circuit that includes a resonator, is connected to the $X_{in}$ and $X_{out}$ terminals 2 and 3, the $X_{in}$ and

2

$X_{out}$ terminals are also called external-component connecting terminals. Reference numerals 40 and 41 are external-component connecting terminals for connecting an external component to a clock signal oscillation circuit (hereinafter, oscillation circuit) 43. Reference numeral 7 is a clock-signal switching circuit for selecting either a clock signal generated by the oscillation circuit 43 or a clock signal generated by a clock-signal generating circuit 44.

Reference numeral 4 is a CR oscillation circuit employed in the clock-signal generating circuit 44. The CR oscillation circuit 4 is used for generating a clock signal with a frequency determined by a capacitor 55 and a resistor connected to the external-component connecting terminals 2 and 3. Reference numeral 5 is an oscillator-driven oscillation circuit employed in the clock-signal generating circuit 44. The oscillator-driven oscillation circuit 5 operates when an oscillator i.e., a circuit that includes a resonator, is connected to the external-component connecting terminals 2 and 3. Reference numerals 20A and 20B each denote a switching circuit for connecting either the CR oscillation circuit 4 or the oscillator-driven oscillation circuit 5 to a external-component connecting terminals 2 and 3. The CR oscillation circuit 4 comprises an inverted logical-product gate (NAND circuit) 51, inverter circuits 52, 53 and 54, the capacitor 55 and a switch 56 which is connected between the NAND gate 51 and a power supply. The oscillator-driven oscillation circuit 5 comprises a NAND gate 57 and a switch 58 connected between the NAND gate 57 and the power supply.

When the supply of power to the microcomputer 30B is started, the clock-signal switching circuit 7 is set to select the clock signal generated by the oscillation circuit 43. As a result, when the reset state of the microcomputer 30B is ended, the clock-signal switching circuit 7 supplies the clock signal generated by the oscillation circuit 43 to internal circuits (not shown) of the microcomputer 30B. Thereafter, after the clock signal generated by the clock-signal generating circuit 44 stabilizes in the microcomputer 30B, the clock-signal switching circuit 7 is switched so as to supply the clock signal generated by the clock-signal generating circuit 44 to the internal circuit (not shown).

When a resistor (not shown), is connected between the external-component connecting terminals 2 and 3, the switch circuits 20A and 20B are set to connect the CR oscillation circuit 4 to the external-component connecting terminals 2 and 3. As a result, a circuit comprising the connected resistor (not shown) and the capacitor 55 is formed and a clock signal with a frequency determined by the resistance and capacitance of the connected resistor (not shown) and the capacitor 55, respectively is supplied to the clock-signal switching circuit 7. It should be noted that the switch 56 is set so as to disconnect the power supply from one of the inputs of the NAND gate 51 and the other input of the NAND gate 51 is set at a high level.

When an oscillator i.e., a circuit that includes a resonator, is connected to the external-component connecting terminals 2 and 3 the switch circuits 20A and 20B are set to connect the oscillator-driven oscillation circuit 5 to the external-component connecting terminals 2 and 3, as shown in FIG. 2. In addition, the switch 58 is set so as to disconnect the power supply from one of the inputs of the NAND gate 57 and the other input of the NAND gate 57 is set at a high level. As a result, the waveform of a signal output by the oscillator is reshaped and output to the clock-signal switching circuit 7 as a clock signal.

In the case of the microprocessor 30B with the configuration described above, the User can select either the CR oscillation having a lack of frequency stability but a good build-up characteristic or the oscillator driven oscillation with a good frequency stability but a poor build-up characteristic.

Since the conventional semiconductor device has the configuration described above, it is possible to preserve the stability of the clock signal at power-on and to select a clock-signal generating circuit desired by the User. Even when the oscillator-driven oscillation circuit 34 or the clock-signal generating circuit 44 is selected, however, the oscillation circuit 33 or 43 continues operating, giving rise to a problem that the current consumed by the semiconductor device increases.

In addition, the operating frequency of the semiconductor device has an upper limit. Thus, it is necessary to design the oscillation circuit 33 or 43 so that the operating frequency thereof does not exceed the upper limit. Therefore, in the case of a low operating-frequency upper limit, it is necessary to increase the capacitance of the capacitor employed in the oscillation circuit 33 or 43. As a result, the size of the layout pattern of the oscillation circuit 33 or 43 increases, giving rise to a problem caused by an increased area of the semiconductor chip.

SUMMARY OF THE INVENTION

It is an object of the present invention to provide a semiconductor device having low power consumption in order to solve the problems encountered in the conventional semiconductor device.

It is another object of the present invention to provide a semiconductor device wherein the size of the layout pattern thereof does not increase even if the upper limit of the operating frequency is not high.

According to one aspect of the preferred embodiment of the present invention, there is provided a semiconductor device comprising:

- a clock signal oscillation circuit for generating a clock signal with a predetermined frequency;
- a CR oscillation circuit for generating a clock signal in conjunction with an external resistor connected to the semiconductor device;
- an oscillator-driven oscillation circuit which is used for generating a clock signal in conjunction with an external oscillator connected to the semiconductor device;
- a clock-signal switching circuit for selecting either the clock signal generated by the CR oscillation circuit or the clock signal generated by the oscillator-driven oscillation circuit and for selecting either the selected clock signal or the clock signal generated by the clock signal oscillation circuit; and
- an oscillation halting circuit for halting the oscillation of the clock signal oscillation circuit at least when the clock-signal switching circuit selects either the clock signal generated by the CR oscillation circuit or the clock signal generated by the oscillator-driven oscillation circuit instead of the clock signal generated by the clock signal oscillation circuit.

According to another aspect of the preferred embodiment of the present invention, the semiconductor device includes a CPU for controlling operations of the semiconductor device whereby, when the clock-signal switching circuit selects either a clock signal generated by the CR oscillation circuit or a clock signal generated by an oscillator-driven oscillation circuit, the CPU receives a control signal from the clock-signal switching circuit, transmitting a control signal for halting the oscillation of the clock signal oscillation circuit to the oscillation halting circuit. Receiving the control signal from the CPU, the oscillation halting circuit halts the oscillation of the clock signal oscillation circuit.

In addition, according to still another aspect of the preferred embodiment of the present invention, the semiconductor device comprises:

- a clock signal oscillation circuit for generating a clock signal with a predetermined frequency;
- a CR oscillation circuit for generating a clock signal in conjunction with an external resistor connected to the semiconductor device;
- an oscillator-driven oscillation circuit for generating a clock signal in conjunction with an external oscillator connected to the semiconductor device;
- a clock-signal switching circuit for selecting either the clock signal generated by the CR oscillation circuit or the clock signal generated by the oscillator-driven oscillation circuit and for selecting either the selected clock signal or the clock signal generated by the clock signal oscillation circuit;
- an oscillation halting circuit which is used for halting the oscillation of the clock signal oscillation circuit at least when the clock-signal switching circuit selects either the clock signal generated by the CR oscillation circuit or the clock signal generated by the oscillator-driven oscillation circuit instead of the clock signal generated by the clock signal oscillation circuit; and
- a frequency divider provided between the clock signal oscillation circuit and the clock-signal switching circuit for dividing the frequency of the clock signal generated by the clock signal oscillation circuit.

According to a still further aspect of the preferred embodiment of the present invention, the semiconductor device further comprises a clock-signal select control circuit which is used for putting only the oscillator-driven oscillation circuit in an operating state all the time in order to let the oscillator-driven oscillation circuit generate the clock signal when the clock-signal switching circuit selects either the clock signal generated by the CR oscillation circuit or the clock signal generated by the oscillator-driven oscillation circuit instead of the clock signal generated by the clock signal oscillation circuit in accordance with the level of a test signal for testing the semiconductor device.

According to a still further aspect of the preferred embodiment of the present invention, the semiconductor device further comprises a test-signal control circuit connected to the clock-signal select control circuit for invalidating the transmission of the test signal to the clock-signal select control circuit, that is, for invalidating the test signal which puts only the oscillator-driven oscillation circuit in an operating state.

DETAILED DESCRIPTION OF THE PREFERRED EMBODIMENTS

The present invention will become more apparent from the following detailed description of some preferred embodiments with reference to accompanying diagrams showing the embodiments.

1st Embodiment

Figure 3:
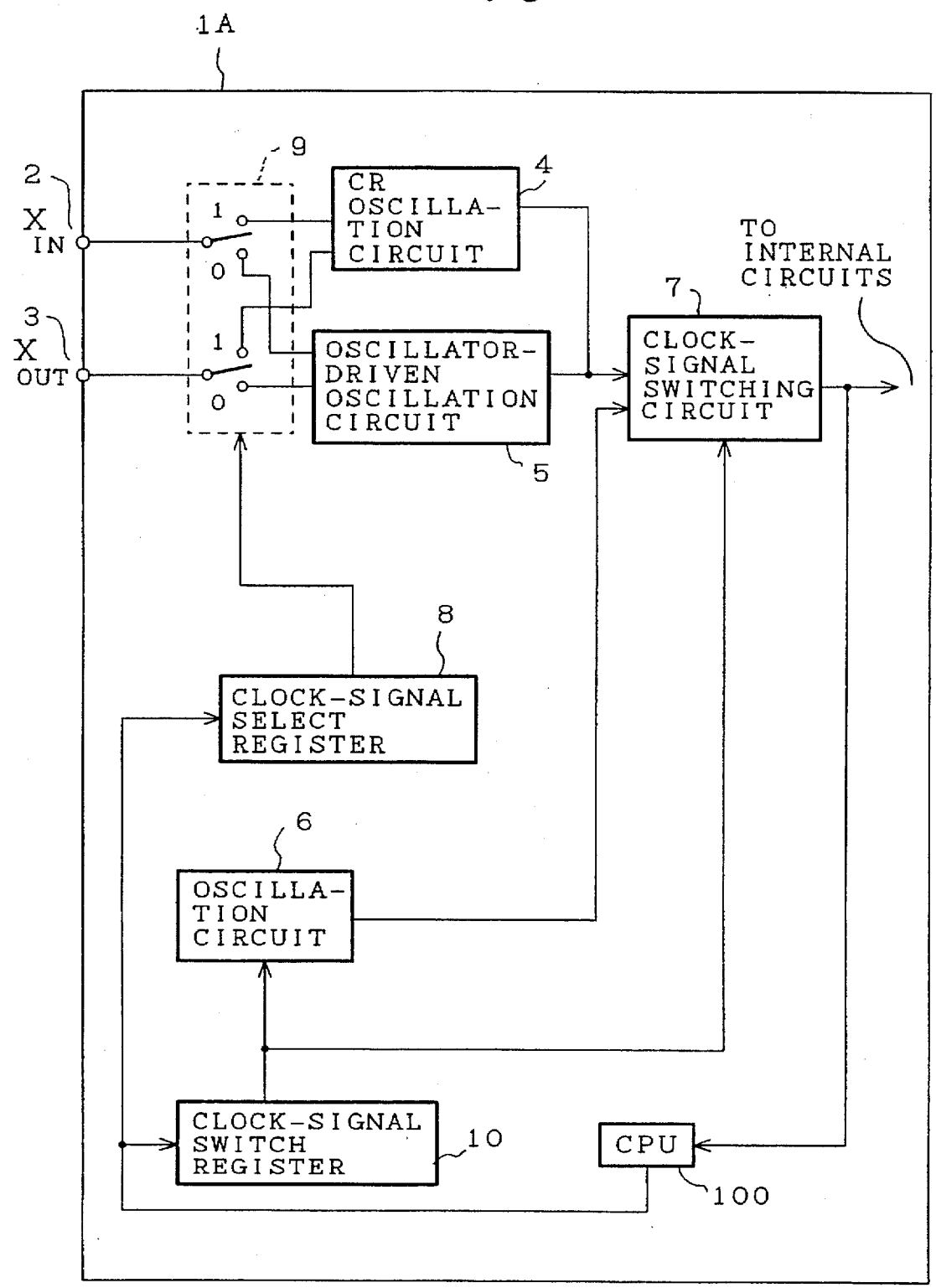
FIG. 3 is a block diagram showing the configuration of a semiconductor device provided by a first embodiment of the present invention focusing on a clock-signal control unit employed therein.

FIG. 3 is a block diagram showing the configuration of a semiconductor device provided by a first embodiment of the present invention focusing on a clock-signal control unit employed therein. The following description explains a microcomputer as an example of the semiconductor device.

Reference numeral 1A shown in the figure is a microcomputer. Reference numerals 2 and 3 in the microcomputer 1A are external-component connecting terminals to which an external component, such as a resistor, a crystal oscillator or a ceramic oscillator, is connected. Reference numeral 4 is a CR oscillation circuit for generating a clock signal, the frequency of which is determined by the resistance of a resistor connected to the external-component connecting terminals 2 and 3 and the capacitance of a capacitor employed in the CR oscillation circuit 4. Reference numeral 5 is an oscillator-driven oscillation circuit which operates when an oscillator is connected to the external-component connecting terminals 2 and 3. Reference numeral 6 is a clock signal oscillation circuit (hereinafter, oscillation circuit) that has a good build-up characteristic. Reference numeral 7 is a clock-signal switching circuit for selecting the clock signal generated by the CR oscillation circuit 4, a clock signal generated by the oscillator-driven oscillation circuit 5, or a clock signal generated by the oscillation circuit 6 as clock signal to be supplied to internal circuits of the microcomputer 1A. Reference numeral 8 is a clock-signal select register for storing information indicating whether the clock signal generated by the CR oscillation circuit 4 or the oscillator-driven oscillation circuit 5 will be selected. Reference numeral 9 is a switch circuit for selecting either the CR oscillation circuit 4 or the oscillator-driven oscillation circuit 5 in accordance with a value set in the clock-signal select register 8. Reference numeral 10 is a clock-signal switch register (serving as a component of an oscillation halting circuit) for storing information indicating which clock signal is to be selected. Reference numeral 100 is a microprocessor (or a CPU) for controlling the operation of the microcomputer 1A and, in particular for providing the clock-signal select register 8 and the clock-signal switch register 10 with control signals for controlling the operation of the clock-signal select register 8 and the clock-signal switch register 10, as will be described below.

Figure 4:
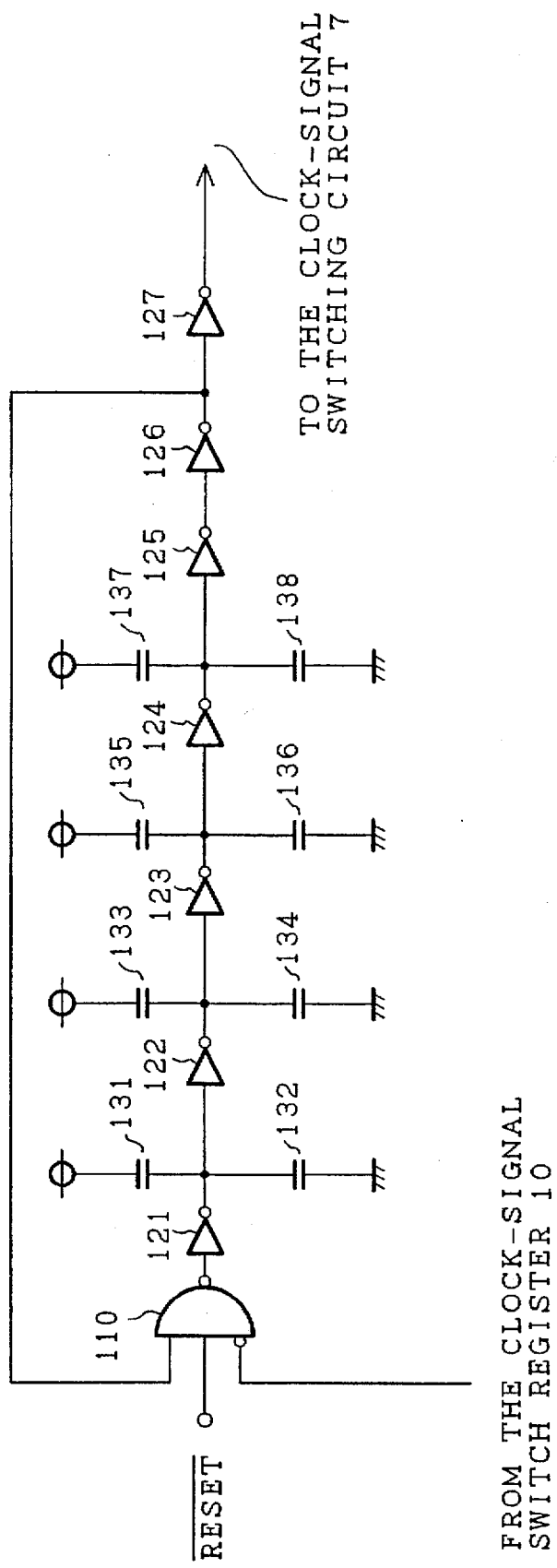
FIG. 4 is a circuit diagram showing a typical configuration of a oscillation circuit employed in the clock-signal control unit shown in FIG. 3.

FIG. 4 is a circuit diagram showing a typical configuration of the oscillation circuit 6 employed in the clock-signal control unit shown in FIG. 3. As shown in FIG. 4, the oscillation circuit 6 is implemented as a ring oscillator. In the typical configuration, the oscillation circuit 6 comprises a gate circuit 110 and inverter circuits 121 to 126 which are connected in series to the gate circuit 110 to serve altogether as a delay element. The gate circuit 110 operates by inputting a signal from the clock-signal switch register 10 and by inputting a signal output by the oscillation circuit 6 as a feedback. To be more specific, a signal output by the inverter circuit 126 is fed back to the gate circuit 110 and the signal is also supplied to the clock-signal switching circuit 7 through an inverter circuit 127. Capacitors 131, 133, 135 and 137 are connected between a power supply and the inputs of the inverter circuits 122, 123, 124 and 125, respectively, and capacitors 132, 134, 136 and 138 are connected between the ground and the inputs of the inverter circuits 122, 123, 124 and 125, respectively.

In addition to the signal from the clock-signal switch register 10 and the feedback signal, the gate circuit 110 also receives a reset signal transmitted by the microcomputer 1A. It should be noted that the gate circuit 110 is a typical implementation of the oscillation halting circuit having a function to halt oscillation.

Next, the operation of the clock-signal control unit is explained.

When the supply of power to the microcomputer 1A is started, the contents of the clock-signal switch register 10 are '0'. In addition, a reset signal supplied by an external source to the microcomputer 1A is set at a low level for a predetermined period of time. With the contents of the clock-signal switch register 10 set at '0', the output of the clock-signal switch register 10 is at a low level and with the output of the clock-signal switch register 10 set at a low level, the clock signal generated by the oscillation circuit 6 would be supplied to internal circuits of the microcomputer 1A. In addition, since the signal from the clock-signal switch register 10 shown in FIG. 4 is set at a low level, the oscillation circuit 6 starts to oscillate as soon as the reset state is ended. The clock signal generated by the oscillation circuit 6 is supplied to internal circuits of the CPU 100 through the clock-signal switching circuit 7, which allows the CPU 100 to start operating. It should be noted that the internal circuits of the CPU 100 are not shown in FIG. 4.

When a resistor (not shown in the figure) is connected to the external-component connecting terminals 2 and 3, information for indicating that the CR oscillation circuit 4 will be selected is set in the clock-signal select register 8. In this example, a high level '1' is set. When the contents of the clock-signal select register 8 set at the high level '1', the clock-signal select register 8 outputs a high-level signal. At that time, the CPU 100 sets the contents of the clock-signal switch register 10 to '1'. When the contents of the clock-signal switch register 10 set at the high level '1', the clock-signal switch register 10 outputs a high-level signal. It should be noted that the CPU 100 can recognize that the external component connected to the external-component connecting terminals 2 and 3 is a resistor from the level of a signal set at a predetermined input signal of the microcomputer 1A by the User.

The signal output by the clock-signal select register 8 is supplied to the switch circuit 9. When the output of the clock-signal select register 8 set at a high level, the switch circuit 9 connects the CR oscillation circuit 4 to the external-component connecting terminals 2 and 3. As a result, a circuit comprising the resistor connected to the external-component connecting terminals 2 and 3 and the capacitor (not shown) employed in the CR oscillation circuit 4 is formed, causing a clock signal with a frequency determined by the resistor and the capacitor supplied to the clock-signal switching circuit 7.

Since the signal output by the clock-signal switch register 10 is set at a high level, the clock-signal switching circuit 7 selects the clock signal output by the CR oscillation circuit 4 or the oscillator-driven oscillation circuit 5 instead of the clock signal output by the oscillation circuit 6 and supplies the selected clock signal to the internal circuits of the microcomputer 1A. In this case, since it is the CR oscillation circuit 4 that is oscillating, the clock signal generated is thereby supplied to the internal circuits of the microcomputer 1A.

When an oscillator is connected to the external-component connecting terminals 2 and 3, a '0' is set in the clock-signal select register 8 and the contents of the clock-signal switch register 10 are set to '1' by the CPU 100. Typically, the oscillator which is not shown in the figure is a crystal oscillator. When the contents of the clock-signal select register 8 set at the low level '0', the clock-signal select register 8 outputs a low-level signal. The signal output by the clock-signal select register 8 is supplied to the switch circuit 9. When the output of the clock-signal select register 8 set at a low level, the switch circuit 9 connects the oscillator-driven oscillation circuit 5 to the external-component connecting terminals 2 and 3.

As a result, the waveform of a signal output by the oscillator is re-shaped by the oscillator-driven oscillation circuit 5 into a clock signal which is then output to the internal circuits of the microcomputer 1A through the clock-signal switch circuit 7. Since the signal output by the clock-signal switch register 10 is set at a high level, the clock-signal switching circuit 7 selects the clock signal output by the CR oscillation circuit 4 or the oscillator-driven oscillation circuit 5 instead of the clock signal output by the oscillation circuit 6 and supplies the selected clock signal to the internal circuits of the microcomputer 1A. In this case, since it is the oscillator-driven oscillation circuit 5 that is oscillating, the clock signal generated thereby is supplied to the internal circuits of the microcomputer 1A.

As shown in FIG. 4, the gate circuit 110, a component in the configuration of the oscillation circuit 6, receives a signal output by the clock-signal switch register 10 as an input signal. In order to select the clock signal output by the CR oscillation circuit 4 or the oscillator-driven oscillation circuit 5 instead of the clock signal output by the oscillation circuit 6, the signal output by the clock-signal switch register 10 must be set at a high level as described above. As a result, the gate circuit 110 employed in the oscillation circuit 6 is put in a blocking state, halting the oscillation of the oscillation circuit 6. In this state, no current is flowing in the oscillation circuit 6. When the microcomputer 1A is driven by either the clock signal generated by the CR oscillation circuit 4 or the clock signal generated by the oscillator-driven oscillation circuit 5, no current is flowing in the oscillation circuit 6 in accordance with control exercised by the clock-signal switch register 10. As a result, the amount of current consumed by the microcomputer 1A can be reduced to a current consumption smaller than that of the conventional microcomputer.

By the same token, the gate circuit 110 employed in the oscillation circuit 6 also receives the reset signal. When the reset signal is set at a low level and when the operation of the microcomputer 1A is halted, the gate circuit 110 is put in a blocking state, halting the oscillation of the oscillation circuit 6.

In such a state, no current is flowing in the oscillation circuit 6 and as a result, the amount of current consumed by the microcomputer 1A, can be reduced to a current consumption smaller than that of the conventional microcomputer.

2nd Embodiment

Figure 5:
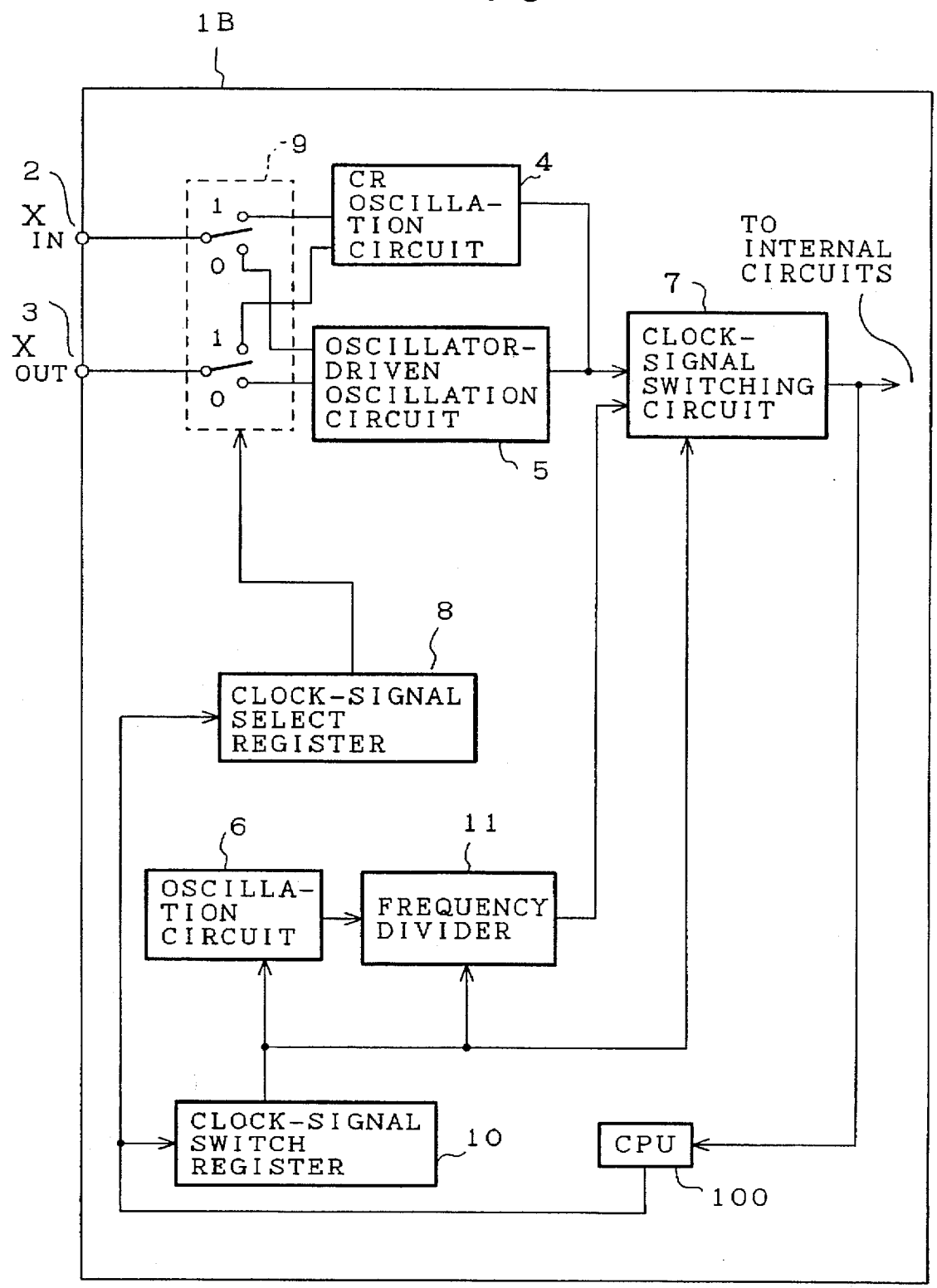
FIG. 5 is a block diagram showing the configuration of a semiconductor device provided by a second embodiment of the present invention focusing on a clock-signal control unit employed therein.

FIG. 5 is a block diagram showing the configuration of a semiconductor device provided by a second embodiment of the present invention focusing on a clock-signal control unit employed therein. Much like the first embodiment, in the case of the second embodiment, a microcomputer is explained as an example of the semiconductor device.

Reference numeral 1B shown in the figure is the microcomputer which employs a frequency divider 11 connected to the output side of the oscillation circuit 6. The rest of the figure is shown in FIG. 3. It is, thus not necessary to repeat the explanation of the remaining portions of the microcomputer 1B shown in the figure.

The operation of the clock-signal control unit shown in the figure is explained as follows.

In the case of the semiconductor device provided by the first embodiment, the clock-signal control unit adopts a configuration wherein the frequency of the oscillation circuit 6 can not exceed the operating frequency of the microcomputer 1A. For a microcomputer 1A with a low operating frequency, the oscillation frequency of the oscillation circuit 6 can not therefore be set at a high value as well. In order to lower the oscillation frequency of the oscillation circuit 6, it is necessary to increase the capacitances of the capacitors 131 to 138 employed in the oscillation circuit 6 as shown in FIG. 4. As a result, the layout pattern size of the oscillation circuit 6 increases. In order to prevent the layout pattern size of the oscillation circuit 6 from increasing, a frequency divider 11 is provided between the oscillation circuit 6 and the clock-signal switching circuit 7. With the frequency divider 11, the frequency of the clock signal generated by the oscillation circuit 6 can be lowered before the clock signal is supplied to the internal circuits of the microcomputer 1B through the clock-signal switching circuit 7. In this way, the oscillation frequency of the oscillation circuit 6 can be set to a high value. In other words, the capacitances of the capacitors 131 to 138 can be each be set at a low value. As a result, the layout pattern size of the oscillation circuit 6 can be reduced.

It should be noted that the control to switch from the clock signal generated by the oscillation circuit 6 to the clock signal generated by the CR oscillation circuit 4 or the clock signal generated by the oscillator-driven oscillation circuit 5 and vice versa is carried out in the same way as the control carried out in the first embodiment. The first embodiment control is based on a control signal output by the CPU 100 for controlling the operations of the clock-signal select register 8, the clock-signal switch register 10, and the clock-signal switching circuit 7.

3rd Embodiment

Figure 6:
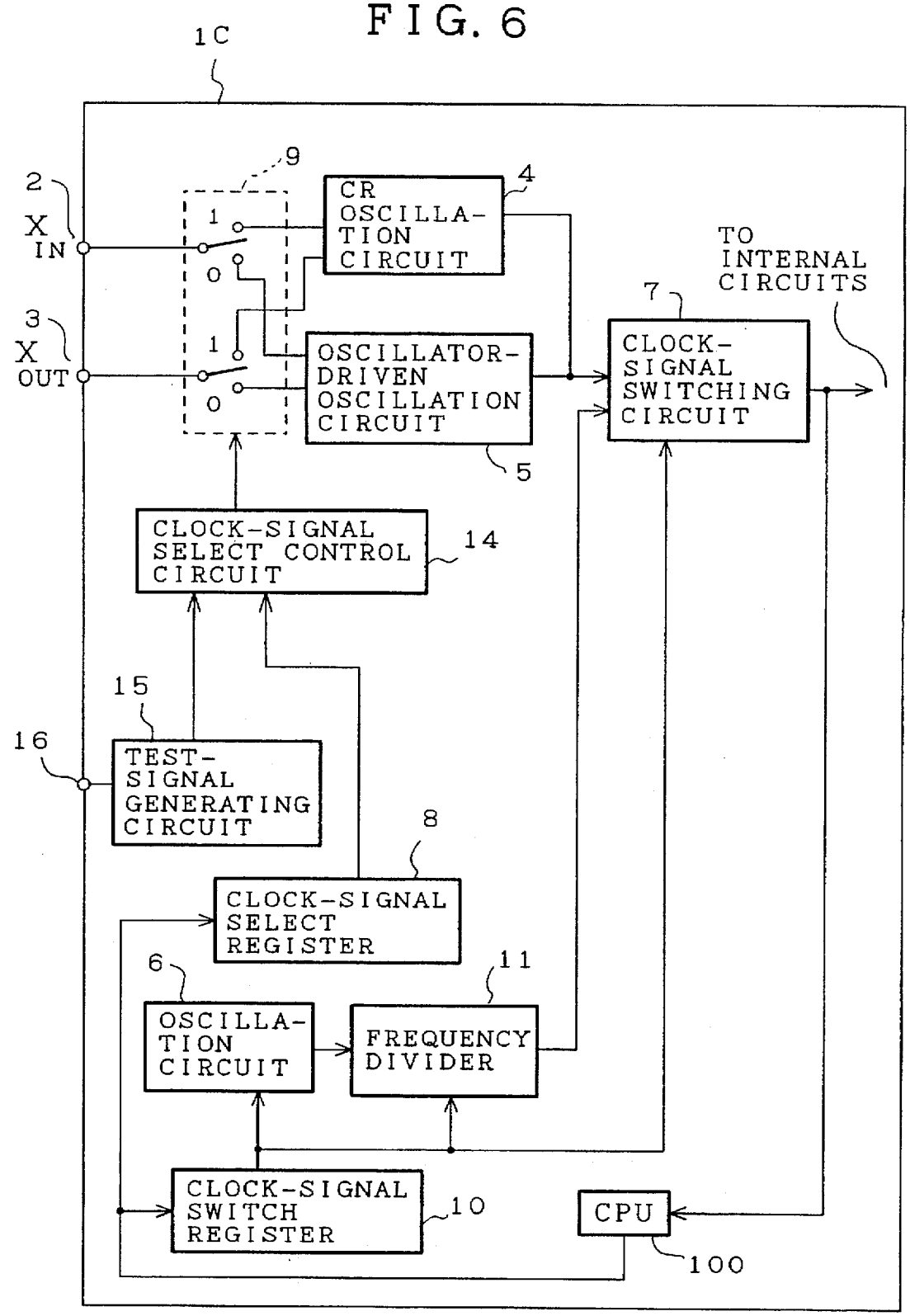
FIG. 6 is a block diagram showing the configuration of a semiconductor device provided by a third embodiment of the present invention focusing on a clock-signal control unit employed therein.

FIG. 6 is a block diagram showing the configuration of a semiconductor device provided by a third embodiment of the present invention focusing on a clock-signal control unit employed therein. Much like the first and second embodiments, in the case of the third embodiment, a microcomputer is explained as an example of the semiconductor device.

The microcomputer provided by the third embodiment as a semiconductor device is designed by taking product testing into consideration. Reference numeral 1C shown in the figure is the microcomputer.

Reference numeral 14 is a clock-signal select control circuit employed in the microcomputer 1C for determining whether a signal output by the clock-signal select register 8 is to be validated or invalidated. Reference numeral 15 is a test-signal generating circuit for controlling the clock-signal select control circuit 14 in accordance with a test requesting signal supplied to the test-signal generating circuit 15 through an input terminal 16. The rest of the figure is the same as the second embodiment shown in FIG. 5. It is thus not necessary to repeat the explanation of the remaining portions of the microcomputer 1C shown in the figure.

The operation of the clock-signal control unit shown in the figure is explained as follows.

Figure 1:
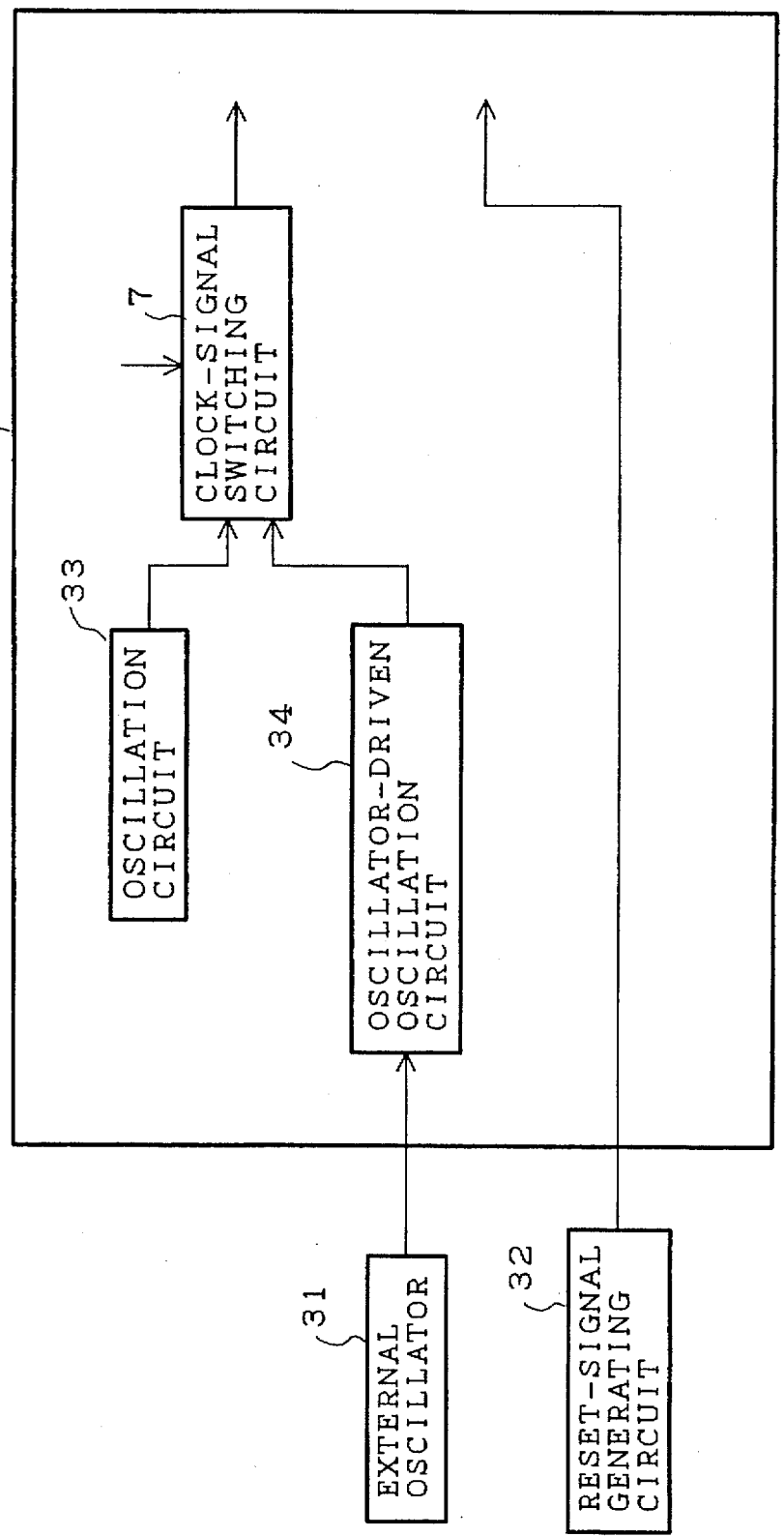
FIG. 1 is a block diagram showing the configuration of a clock-signal control unit of the conventional microcomputer.
Figure 2:
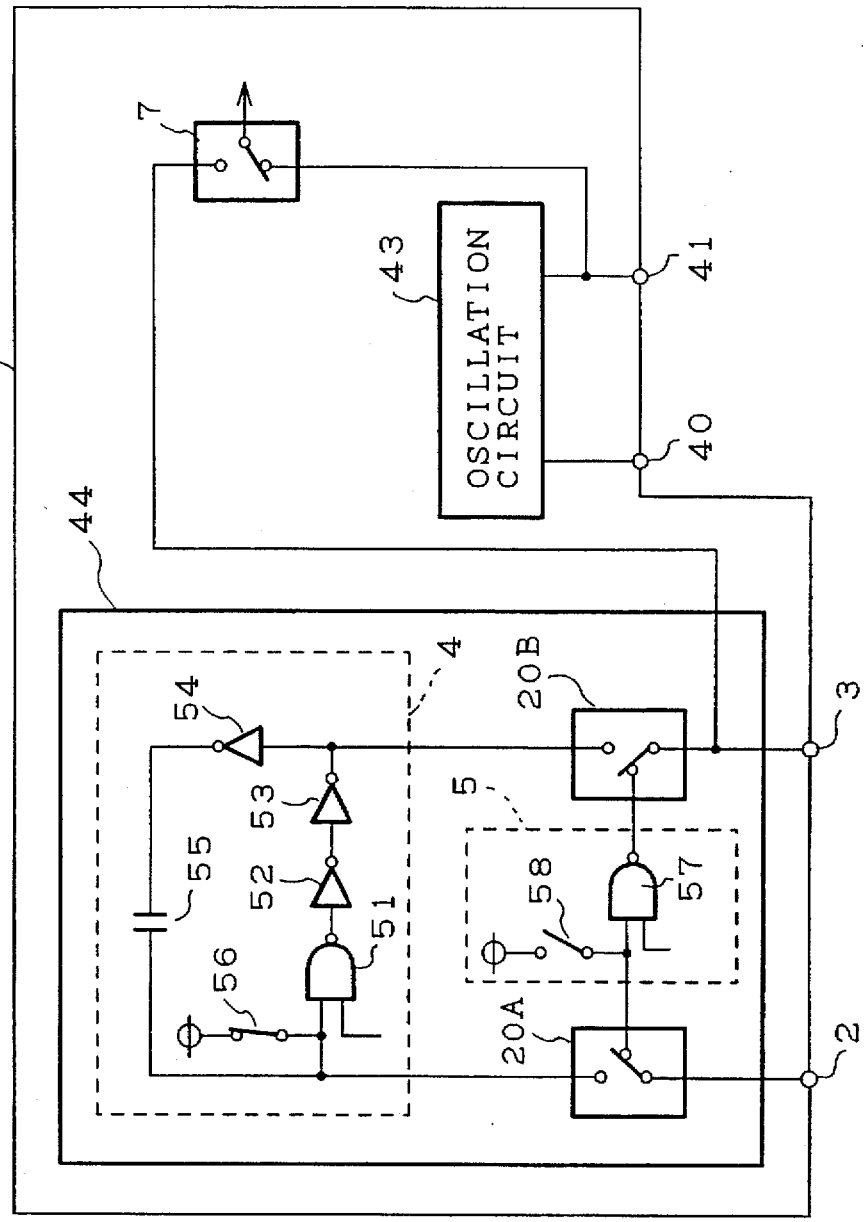
FIG. 2 is a block diagram showing the configuration of another clock-signal control unit of the conventional microcomputer.

In general, during a product test, a clock signal generated by a tester instrument is supplied to the microcomputer 1C through the external-component connecting terminal 2. The CR oscillation circuit 4 includes a capacitor 55 as is typically shown in FIG. 2. Thus, when the CR oscillation circuit 4 is selected, the clock signal generated by the tester instrument may not be transmitted correctly to the internal circuits of the microcomputer 1C. For this reason, it is necessary to devise the clock-signal control so as to always select the oscillator-driven oscillation circuit 5 during a product test. By always setting the contents of the clock-signal select register 8 to '0' during a product test, the oscillator-driven oscillation circuit 5 is selected. In this case, however, it is impossible to conduct a test to determine whether or not the operation to select a clock signal by using the clock-signal select register 8 is normal.

In order to solve the problem described above, the clock-signal select control circuit 14 and the test-signal generating circuit 15 are incorporated in the configuration of the semiconductor device provided by the 3rd embodiment. When the test-signal generating circuit 15 generates a signal requesting a product test, the clock-signal select control circuit 14 outputs a '0' signal to the switch circuit 9 without regard to the contents of the clock-signal select register 8. When the test-signal generating circuit 15 does not generate the signal requesting a product test, the signal output by the clock-signal select register 8 is supplied to the switch circuit 9. It should be noted that the contents of the clock-signal select register 8 are also output to a predetermined output terminal of the microcomputer 1C as well.

During a product test, a test signal is supplied to the input terminal 16 for requesting the test-signal generating circuit 15 to output the signal requesting a product test to the clock-signal select control circuit 14. The test signal is set typically at a high level. Receiving the signal requesting a product test, the clock-signal select control circuit 14 always outputs a '0' signal to the switch circuit 9. Accordingly, the switch circuit 9 always connects the external-component connecting circuit 2 and 3 to the oscillator-driven oscillation circuit 5. Since the oscillator-driven oscillation circuit 5 typically has a configuration shown in FIG. 2, the clock signal generated by the tester instrument is supplied to the clock-signal switching circuit 7 without any problem. As a result, when the clock-signal switching circuit 7 is switched to select the clock signal from the CR oscillation circuit 4 or the oscillator-driven oscillation circuit 5, a normal clock signal is supplied to the internal circuits of the microcomputer 1C.

As described above, since the contents of the clock-signal select register 8 are output to a predetermined output terminal of the microcomputer 1C, the test technician can recognize whether or not the clock-signal select register 8 operates normally by monitoring the state of the predetermined output terminal. It should be noted that the contents of the clock-signal select register 8 are output to the predetermined output terminal by a program used for testing. The program reads out the contents of the clock-signal select register 8 and outputs the contents to the predetermined output terminal. In the alternative, the clock-signal select register 8 may be hard-wired to the to output the contents thereof to the predetermined output terminal.

In a real operation, a signal indicating a non-testing operation is supplied to the input terminal 16. Typically, the signal is a control signal having a low level. In this case, the test-signal generating circuit 15 generates a non-test signal to the clock-signal select control circuit 14. Receiving the non-testing signal, the clock-signal select control circuit 14 executes control to pass on the output of the clock-signal select register 8 to the switch circuit 9. In this state, the control to switch from the clock signal generated by the oscillation circuit 6 to the clock signal generated by the CR oscillation circuit 4 or the clock signal generated by the oscillator-driven oscillation circuit 5 and vice versa is carried out in the same way the same as the control carried out in the semiconductor devices provided by the first and second embodiments.

As described above, according to the third embodiment, it is possible to provide a semiconductor device that can select a clock-signal generating circuit as desired by the user and to verify the operation of the semiconductor device with a high degree of reliability.

4th Embodiment

Figure 7:
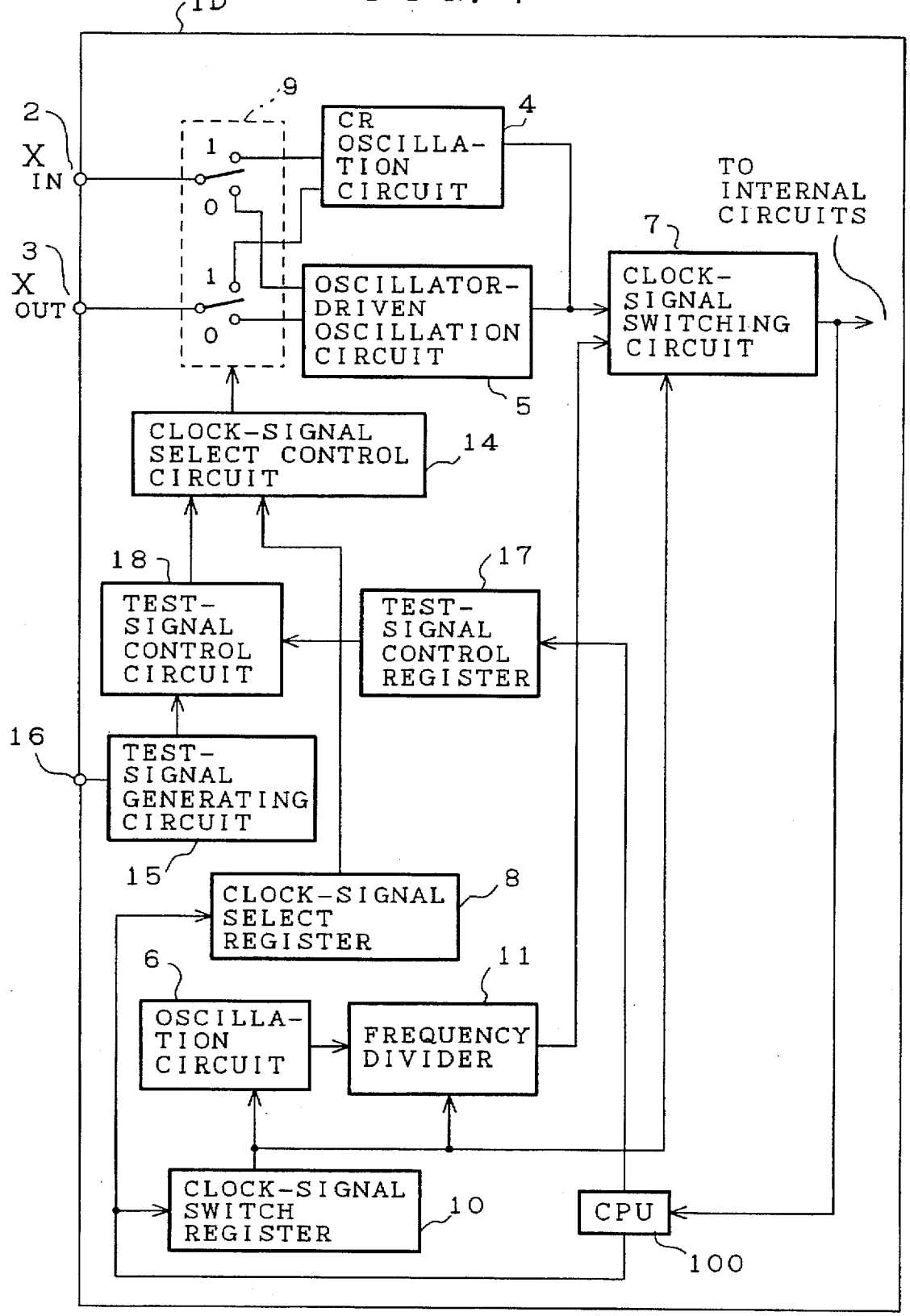
FIG. 7 is a block diagram showing the configuration of a semiconductor device provided by a fourth embodiment of the present invention focusing on a clock-signal control unit employed therein.

FIG. 7 is a block diagram showing the configuration of a semiconductor device provided by a fourth embodiment of the present invention focusing on a clock-signal control unit employed therein. Much like the first, second and third embodiments, in the case of the fourth embodiment, a microcomputer is explained as an example of the semiconductor device.

Much like the third embodiment, the microcomputer provided by the fourth embodiment as a semiconductor device is designed by taking product testing into consideration too. Reference numeral 1D shown in the figure is the microcomputer.

Reference numeral 17 in the microcomputer 1D is a test-signal control register for storing information to indicate whether a test mode to be set or reset while reference numeral 18 is a test-signal control circuit for determining whether a test signal is to be passed on or blocked in accordance with the contents of the test-signal control register 17. The rest of the figure is the same as the third embodiment shown in FIG. 6. It is thus not necessary to repeat the explanation of the remaining portions of the microcomputer 1D shown in the figure.

The operation of the clock-signal control unit shown in the figure is explained as follows.

When the contents of the test-signal control register 17 are '0', the test-signal control circuit 18 passes on the test signal from the test-signal generating circuit 15. When the contents of the test-signal control register 17 are '1', on the other hand, the test-signal control circuit 18 blocks the test signal from the test-signal generating circuit 15, supplying the clock-signal select control signal 14 with a signal indicating that there is no request for a test.

During a product test, when it is desired to operate the microcomputer 1D by using a clock signal generated by a tester instrument not shown in the figure, the CPU 100 sets the contents of the test-signal control register 17 to '0'. With the contents of the test-signal control register 17 set to '0', the test-signal control circuit 18 passes on the test signal from the test-signal generating circuit 15 to the clock-signal select control circuit 14. In this state, if a test signal is supplied to the input terminal 16 for requesting the test-signal generating circuit 15 to output a signal requesting a product test to the clock-signal select control circuit 14, the test-signal generating circuit 15 outputs the signal requesting a product test. The test signal is set typically at a high level. Since the test-signal control circuit 18 is set in a state to pass on the signal requesting a product test from the test-signal generating circuit 15, the signal is supplied to the clock-signal select control circuit 14. Thus, in this state, the switch circuit 9 connects the external-component connecting terminals 2 and 3 to the oscillator-driven oscillation circuit 5 as is the case with the third embodiment. As a result, the microcomputer 1D operates in accordance with the clock signal generated by the tester instrument.

In the case of the third embodiment, the oscillator-driven oscillation circuit 5 is always selected during a product test. As a result, it is not possible to verify whether or not the CR oscillation circuit 4 operates normally. On the other hand, it is also impossible to verify whether or not the clock-signal select control circuit 14 carries out switching operations in accordance with the contents of the clock-signal select register 8 with a high degree of reliability. In the case of the fourth embodiment, however, by setting the contents of the test-signal control register 17 to '1', the normal operations of the CR oscillation circuit 4 and the clock-signal select control circuit 14 can be verified. That is to say, when it is desired to verify these operations during a product test, the CPU sets the contents of the test-signal control register 17 to '1'.

With the contents of the test-signal control register 17 set to '1', the test-signal control circuit 18 blocks the test signal from the test-signal generating circuit 15, allowing the clock-signal select control circuit 14 to carry out an operation to select a clock signal in accordance with the contents of the clock-signal select register 8. When the contents of the clock-signal select register 8 are set to '1', the clock-signal select register 8 requests that the external-component connecting terminals 2 and 3 be connected to the CR oscillation circuit 4. As a result, when a resistor is connected to the external-component connecting terminals 2 and 3, the clock signal generated by the CR oscillation circuit 4 ought to be supplied to the internal circuits of the microcomputer ID. That is to say, a normal operation of the microcomputer 1D in this state indicates that the CR oscillation 4 is also normally operating as well.

In a real operation other than the testing, a signal indicating a non-testing operation is supplied to the input terminal 16. Typically, the signal is a control signal having a low level. In this case, the test-signal control circuit 18 generates a non-test signal to the clock-signal select control circuit 14. Receiving the non-testing signal, the clock-signal select control circuit 14 executes control to pass on the output of the clock-signal select register 8 to the switch circuit 9. In this state, the control to switch from the clock signal generated by the oscillation circuit 6 to the clock signal generated by the CR oscillation circuit 4 or the clock signal generated by the oscillator-driven oscillation circuit 5 and vice versa is carried out in the same way the same as the control carried out in the semiconductor devices provided by the first and second embodiments.

As described above, according to the fourth embodiment, the normal operations of the CR oscillation circuit 4 and the clock-signal select control circuit 14 can be verified, allowing a product test to be carried forward with a high degree of efficiency.

As has been described in detail so far, according to one aspect of the present invention, the semiconductor device has a configuration which includes an oscillation halting circuit for halting the oscillation of the clock signal oscillation circuit at least when the clock-signal switching circuit selects either the clock signal generated by the CR oscillation circuit or the clock signal generated by the oscillator-driven oscillation circuit instead of the clock signal generated by the clock signal oscillation circuit. That is to say, with the clock signal generated by the clock signal oscillation circuit not selected, the operation of the clock signal oscillation circuit is halted. As a result, the amount of current consumed by the semiconductor device can be reduced.

In addition, according to another aspect of the present invention, the semiconductor device has a configuration which includes a frequency divider provided at a later stage of the embedded clock signal oscillation circuit for dividing the frequency of the clock signal generated by the clock signal oscillation circuit. As a result, the frequency of the clock signal oscillation circuit can be set at a high value even if the upper limit of the operating frequency of the semiconductor device is not so high. As a result, the layout pattern of the semiconductor device does not increase in size.

Further, according to still another aspect of the present invention, the semiconductor device has a configuration wherein the oscillator-driven oscillation circuit is always selected when the clock signal generated by the CR oscillation circuit or the oscillator-driven oscillation circuit is selected in accordance with a test signal. As a result, a test of the semiconductor device by using a clock signal generated by a tester instrument can be carried out with a high degree of efficiency.

By the same token, according to a still further aspect of the present invention, the semiconductor device has a configuration which includes a test-signal control circuit for invalidating a test signal for putting only the oscillator-driven oscillation circuit in an operating state. As a result, the clock-signal control unit can also be tested with a high degree of reliability during a test of the semiconductor device.

What is claimed is:

1. A clock signal generation and test circuit comprising:
   a clock signal oscillation circuit for generating a first clock signal having a first frequency;
   a capacitor-resistor (CR) oscillation circuit for generating a second clock signal when an external resistor is connected to the clock signal generation and test circuit;
   an oscillator-driven oscillation circuit for generating a third clock signal when an external oscillator is connected to the clock signal generation and test circuit;
   a clock signal select register for producing a first signal having a first level for activating the CR oscillation circuit and a second level for activating the oscillator-driven oscillation circuit;
   a test signal generating circuit for generating a second signal having a first level during testing and a second level during normal operation;
   a clock signal select control circuit coupled to the clock signal select register and the test signal generating circuit for producing a third signal having a first level during testing, regardless of the level of the first signal, and said first or a second level corresponding to the level of the first signal, during normal operation;

a switching circuit for activating the oscillator-driven oscillation circuit to generate the third clock signal in response to the first level of the third signal and for activating the CR oscillation circuit to generate the second clock signal in response to the second level of the third signal;

a clock signal switching register for producing a fourth signal having a first level for selecting the first clock signal and a second level for selecting one of the second and third clock signals;

a clock signal switching circuit for selecting the first clock signal generated in response to the first level of the fourth signal and one of the second and third clock signals in response to the second level of the fourth signal; and an oscillation halting circuit for halting oscillation of the clock signal oscillation circuit when the clock signal switching circuit selects one of the second and third clock signals.

2. The clock signal generation and test circuit according to claim 1 including a CPU for controlling the clock signal generation and test circuit, wherein when the clock signal switching circuit selects one of the second and third clock signals, the clock signal switching circuit transmits a control signal to the CPU and, in response, the CPU transmits a control signal for halting oscillation of the clock signal oscillation circuit to the oscillation halting circuit and, upon receiving said control signal from said CPU, the oscillation halting circuit halts oscillation of the clock signal oscillation circuit.

3. The clock signal generation and test circuit according to claim 1 comprising a test signal control circuit connected to the clock signal select control circuit for invalidating transmission of the second signal to the clock signal select control circuit.

4. A clock signal generation and test circuit comprising:

a clock signal oscillation circuit for generating a first clock signal having a first frequency;

a capacitor-resistor (CR) oscillation circuit for generating a second clock signal when an external resistor is connected to the clock signal generation and test circuit;

an oscillator-driven oscillation circuit for generating a third clock signal when an external oscillator is connected to the clock signal generation and test circuit;

a clock signal select register for producing a first signal having a first level for activating the CR oscillation circuit and a second level for activating the oscillator-driven oscillation circuit;

a test signal generating circuit for generating a second signal having a first level during testing and a second level during normal operation;

a clock signal select control circuit coupled to the clock signal select register and the test signal generating circuit for producing a third signal having a first level during testing, regardless of the level of the first signal, and said first or a second level corresponding to the level of the first signal, during normal operation;

a switching circuit for activating the oscillator-driven oscillation circuit to generate the third clock signal in response to the first level of the third signal and for activating the CR oscillation circuit to generate the second clock signal in response to the second level of the third signal;

a clock signal switching register for producing a fourth signal having a first level for selecting the first clock signal and a second level for selecting one of the second and third clock signals;

a clock signal switching circuit for selecting the first clock signal in response to the first level of the fourth signal and one of the second and third clock signals in response to the second level of the fourth signal;

an oscillation halting circuit for halting oscillation of the clock signal oscillation circuit when the clock signal switching circuit selects one of the second and third clock signals; and a frequency divider connected between the clock signal oscillation circuit and the clock signal switching circuit for dividing a frequency of the first clock signal.

5. The clock signal generation and test circuit according to claim 4 including a CPU for controlling the clock signal generation and test circuit, wherein when the clock signal switching circuit selects one of the second and third clock signals, the clock signal switching circuit transmits a control signal to the CPU and, in response, the CPU transmits a control signal for halting oscillation of the clock signal oscillation circuit to the oscillation halting circuit and, upon receiving the control signal from the CPU, the oscillation halting circuit halts oscillation of the clock signal oscillation circuit.

6. The clock signal generation and test circuit according to claim 4 comprising a test signal control circuit connected to the clock signal select control circuit for invalidating transmission of the second signal to the clock signal select control circuit.

\* \* \* \* \*